United States Patent
Yokoyama et al.

(10) Patent No.: US 11,069,602 B2
(45) Date of Patent: Jul. 20, 2021

(54) PACKAGE AND TERMINAL ARRANGEMENT FOR SEMICONDUCTOR MODULE

(71) Applicant: Mitsubishi Electric Corporation, Tokyo (JP)

(72) Inventors: Shuhei Yokoyama, Tokyo (JP); Shogo Shibata, Tokyo (JP); Maki Hasegawa, Tokyo (JP); Koichiro Noguchi, Tokyo (JP); Shigeru Mori, Tokyo (JP); Toru Iwagami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 35 days.

(21) Appl. No.: 16/349,292

(22) PCT Filed: Nov. 22, 2016

(86) PCT No.: PCT/JP2016/084553
§ 371 (c)(1),
(2) Date: May 13, 2019

(87) PCT Pub. No.: WO2018/096573
PCT Pub. Date: May 31, 2018

(65) Prior Publication Data
US 2020/0194353 A1    Jun. 18, 2020

(51) Int. Cl.
*H01L 23/495* (2006.01)
*H01L 23/28* (2006.01)
(Continued)

(52) U.S. Cl.
CPC .. *H01L 23/49562* (2013.01); *H01L 23/49531* (2013.01); *H01L 23/49575* (2013.01);
(Continued)

(58) Field of Classification Search
CPC ......... H01L 23/49531; H01L 23/49575; H01L 25/18; H01L 25/041; H01L 25/065;
(Continued)

(56) References Cited

U.S. PATENT DOCUMENTS

2012/0161303 A1    6/2012  Tomita
2014/0061673 A1*   3/2014  Miyanagi .............. H01L 25/072
                                                           257/77
2014/0367846 A1*  12/2014  Nakagawa ........ H01L 23/49575
                                                          257/713

FOREIGN PATENT DOCUMENTS

JP    2000-138342 A    5/2000
JP    2008-053748 A    3/2008
(Continued)

OTHER PUBLICATIONS

International Search Report issued in PCT/JP2016/084553; dated Feb. 7, 2017.
(Continued)

*Primary Examiner* — Caleb E Henry
*Assistant Examiner* — Dilinh P Nguyen
(74) *Attorney, Agent, or Firm* — Studebaker & Brackett PC

(57) ABSTRACT

The present invention is a semiconductor module including: first and second drive circuits that perform drive control of at least one pair of first and second switching devices, in which the at least one pair of first and second switching devices and the first and second drive circuits are sealed in a package having a rectangular shape in plan view, and there are provided: a control terminal provided to protrude from a side surface of a first long side out of first and second long sides of the package, and to which a control signal of the first and second drive circuits is inputted; an output terminal provided to protrude from a side surface of the second long side; a first main terminal provided to protrude from a side
(Continued)

surface of a first short side out of first and second short sides of the package; and a second main terminal provided to protrude from a side surface of the second short side.

10 Claims, 17 Drawing Sheets

(51) Int. Cl.
*H01L 25/18* (2006.01)
*H02M 1/08* (2006.01)
*H02M 7/00* (2006.01)
*H02M 7/537* (2006.01)
*H01L 23/00* (2006.01)

(52) U.S. Cl.
CPC .............. *H01L 25/18* (2013.01); *H02M 1/08* (2013.01); *H02M 7/003* (2013.01); *H02M 7/537* (2013.01); *H01L 24/48* (2013.01); *H01L 2224/48137* (2013.01); *H01L 2224/48247* (2013.01)

(58) Field of Classification Search
CPC ....... H01L 25/07; H01L 25/165; H01L 21/56; H01L 23/28; H01L 31/048; H01L 24/42; H02M 1/08; H02M 7/003; H02M 7/537
USPC .................................................. 257/666, 787
See application file for complete search history.

(56) References Cited

FOREIGN PATENT DOCUMENTS

| | | |
|---|---|---|
| JP | 2014-090006 A | 5/2014 |
| JP | 2015-002185 A | 1/2015 |
| JP | 2016-163442 A | 9/2016 |
| WO | 2011/048719 A1 | 4/2011 |

OTHER PUBLICATIONS

An Office Action mailed by the Japanese Patent Office dated Dec. 3, 2019, which corresponds to Japanese Patent Application No. 2018-552283 and is related to U.S. Appl. No. 16/349,292; with English language translation.

* cited by examiner

F I G . 1 1
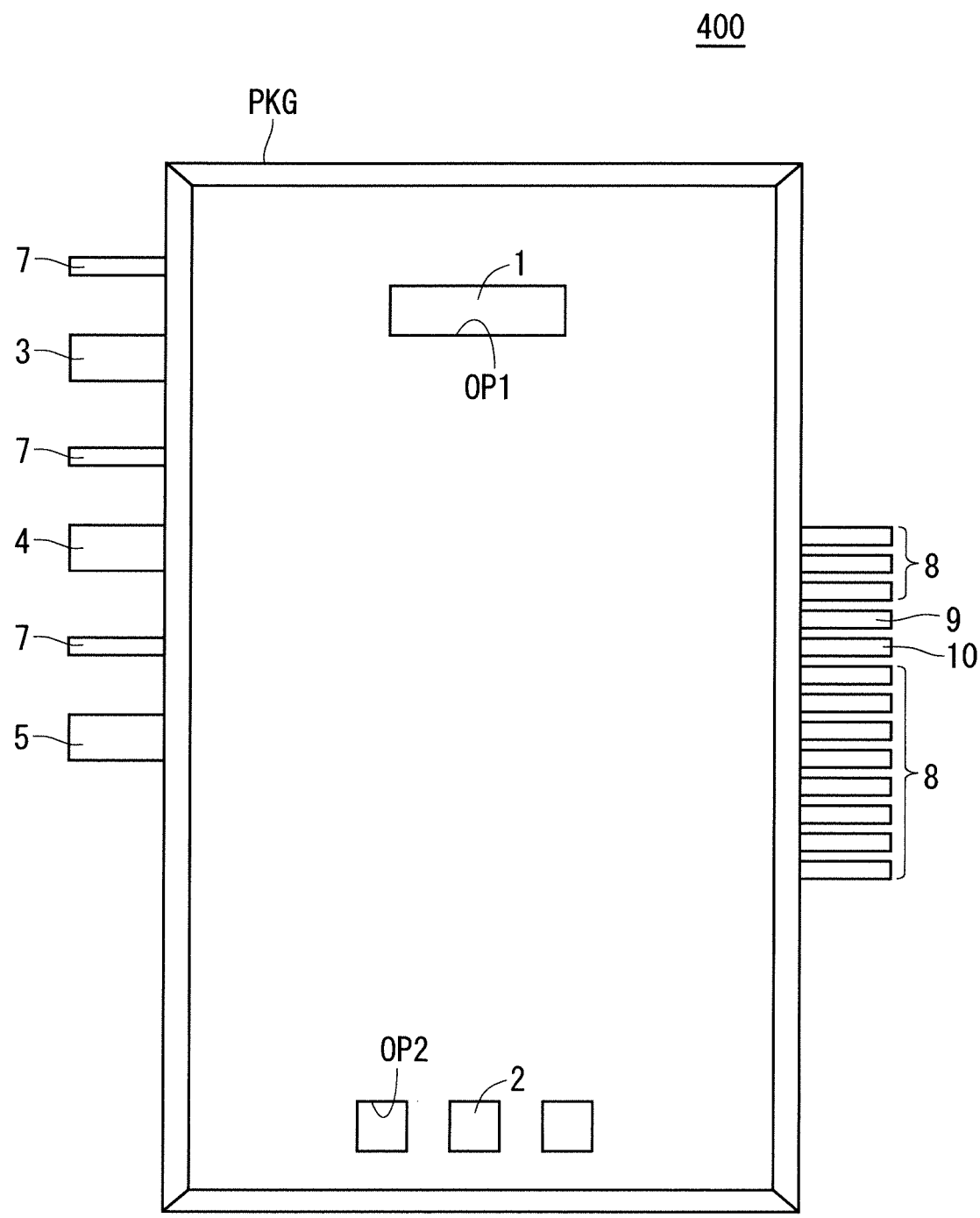

F I G . 1 2
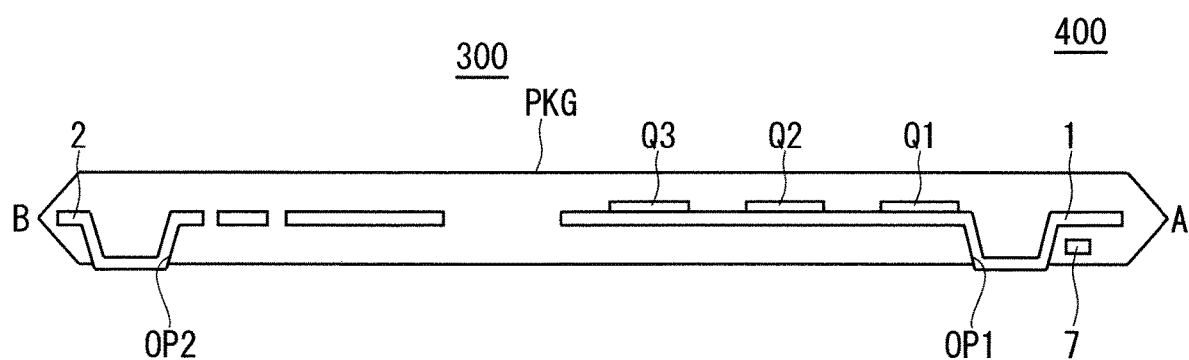

PACKAGE AND TERMINAL ARRANGEMENT FOR SEMICONDUCTOR MODULE

TECHNICAL FIELD

The present invention relates to a semiconductor module, and particularly to a surface-mount semiconductor module.

BACKGROUND ART

As board mounting for joining electronic components to a printed board, while it is mentioned insertion mounting in which a lead of an electronic component is inserted and joined to a through hole provided on a printed board, surface mounting in which an electrode of an electronic component is joined to a pad provided on a surface of a printed board, and the like, surface mounting has an advantage that a mounting process can be simplified and the like by using a surface-mount semiconductor module. Patent Document 1 discloses a surface-mount semiconductor module as a power module, and a surface-mount semiconductor module has been put to practical use.

PRIOR ART DOCUMENTS

Patent Documents

Patent Document 1: Japanese Patent Application Laid-Open No. 2015-002185

SUMMARY

Problem to be Solved by the Invention

In the semiconductor module disclosed in Patent Document 1, main terminals called a P-phase terminal and an N-phase terminal are arranged side by side on the same side of a module package, and there has been a problem that it is difficult to secure a creepage distance between both terminals.

The present invention has been made to solve the above-mentioned problem, and it is an object to provide a semiconductor module having a creepage distance between a P-phase terminal and an N-phase terminal secured.

Means to Solve the Problem

The semiconductor module according to the present invention includes at least one pair of first and second switching devices that are inserted in series between a first potential and a second potential lower than the first potential and operate complementarily, a first drive circuit that performs drive control of the first switching device, and a second drive circuit that performs drive control of the second switching device; the at least one pair of first and second switching devices and the first and second drive circuits are sealed in a package having a rectangular shape in plan view; and there are provided a control terminal provided so as to protrude from a side surface of a first long side out of first and second long sides of the package and to which a control signal of the first and second drive circuits is inputted, an output terminal provided so as to protrude from a side surface of the second long side and to which an output of the first and second switching devices is applied, a first main terminal provided so as to protrude from a side surface of a first short side out of first and second short sides of the package and to which the first potential is applied, and a second main terminal provided so as to protrude from a side surface of the second short side and to which the second potential is applied.

Effects of the Invention

According to the semiconductor module of the present invention, it is possible to obtain a semiconductor module having a creepage distance between the first main terminal and the second main terminal secured.

BRIEF DESCRIPTION OF DRAWINGS

FIG. 11 is a view showing an appearance on a lower surface side of the fourth embodiment according to the present invention.

FIG. 12 is a cross-sectional view showing a configuration of the semiconductor module of the fourth embodiment according to the present invention.

DESCRIPTION OF EMBODIMENTS

First Embodiment

Figure 1:
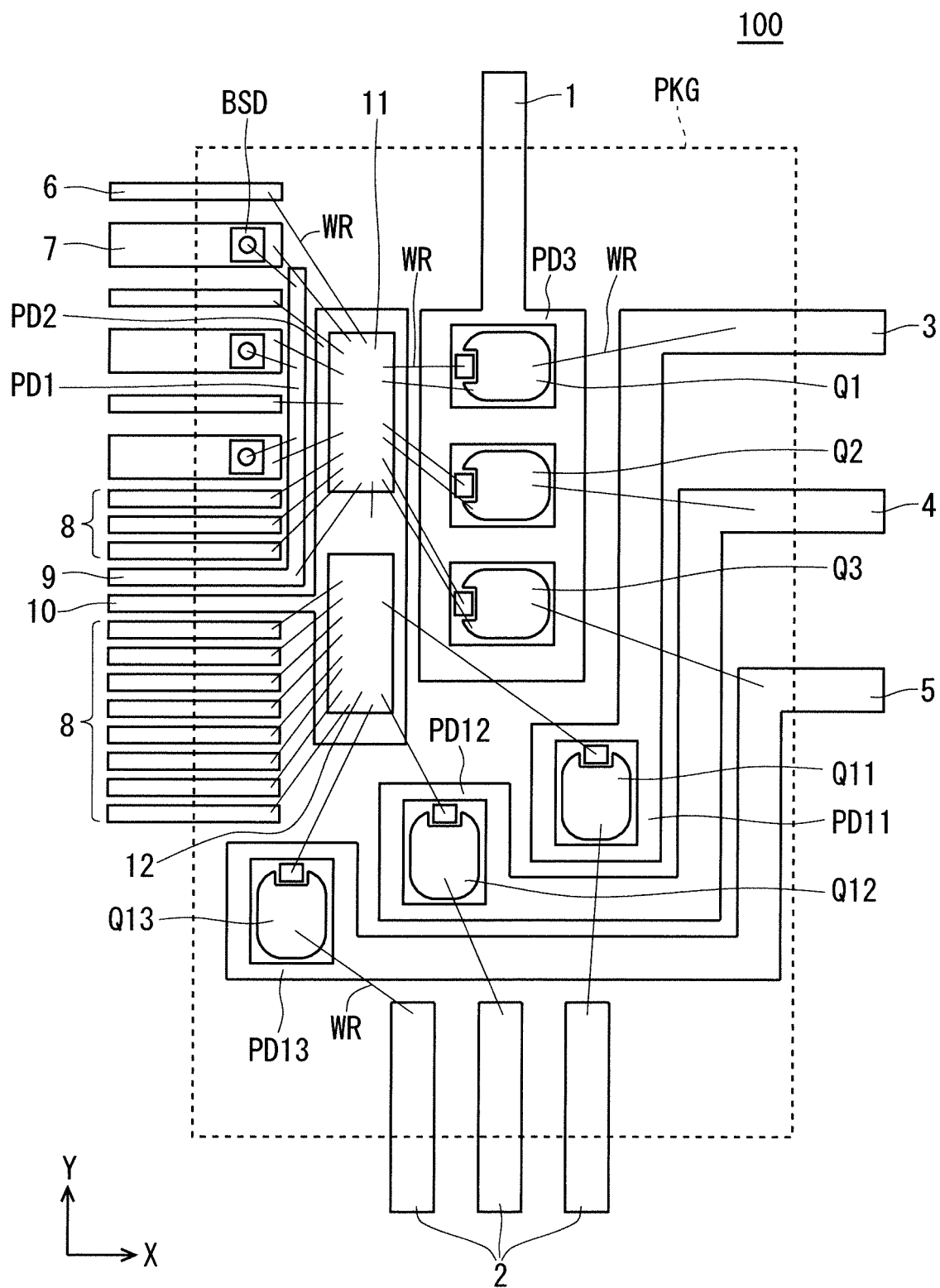
FIG. 1 is a view showing a configuration of a semiconductor module of a first embodiment according to the present invention.

FIG. 1 is a view showing a configuration of a semiconductor module 100 of a first embodiment according to the present invention, in which a package PKG is omitted in order to show a structure inside the package PKG. Further, FIG. 2 shows an appearance of an upper surface side of the semiconductor module 100 in a state sealed with the package PKG.

Figure 2:
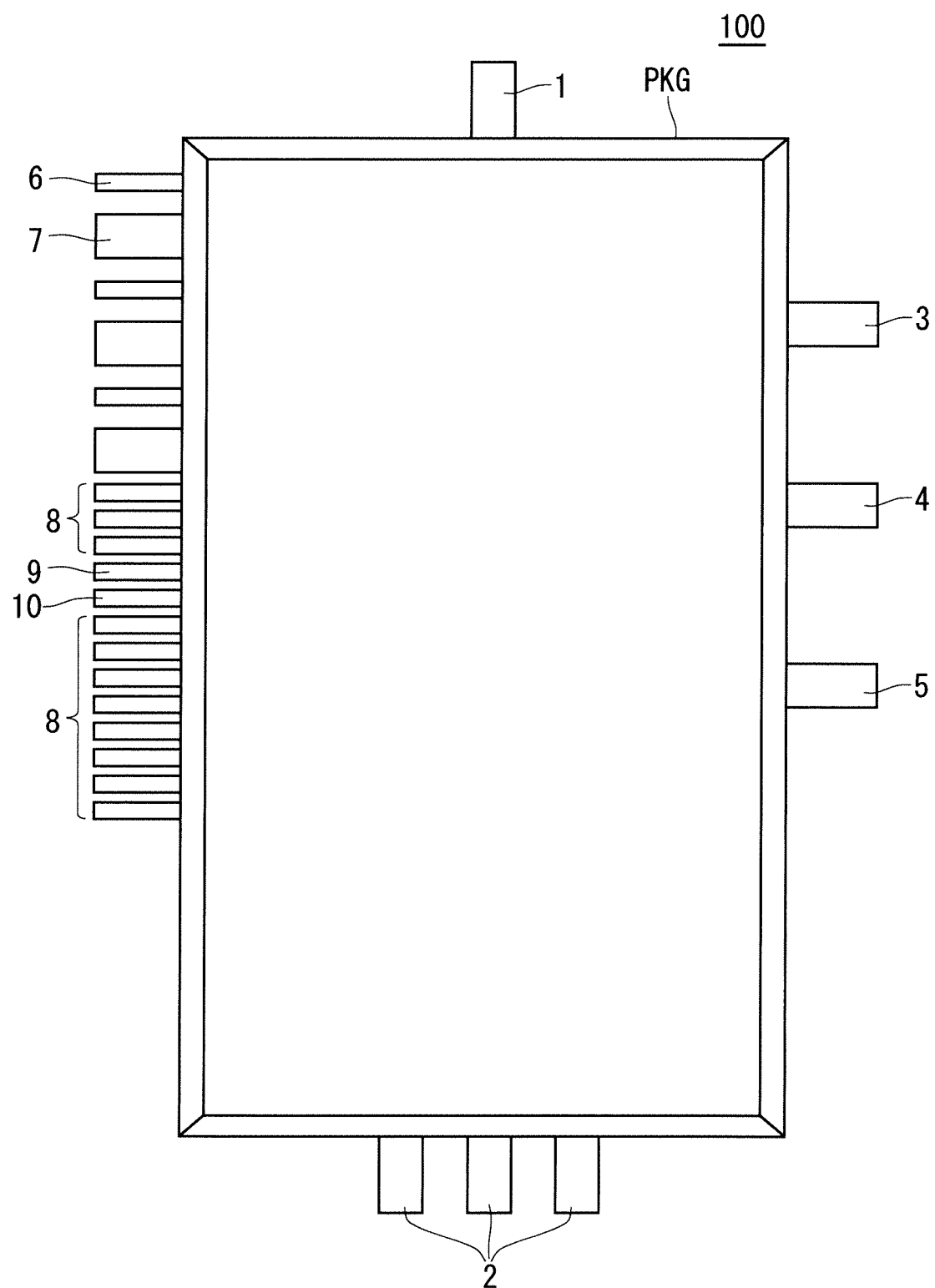
FIG. 2 is a view showing an appearance on an upper surface side of the first embodiment according to the present invention.

As shown in FIGS. 1 and 2, the semiconductor module 100 is a surface-mount module, and includes a high-potential-side reference voltage terminal 6, a high-potential-side driving voltage terminal 7, a control terminal 8, a control power terminal 9, and a ground terminal 10 on one long side (first long side) out of two long sides of the package PKG having a rectangular shape in plan view, and includes a U-phase output terminal 3, a V-phase output terminal 4, and a W-phase output terminal 5 on the other long side (second long side). Further, a P-phase terminal 1 (first main terminal), which is a power terminal, is provided on one short side (first short side) out of two short sides of the package PKG, and an N-phase terminal 2 (second main terminal), which is a power terminal, is provided on the other short side (second short side). Meanwhile, the P-phase terminal 1 and the N-phase terminal 2 are respectively disposed at center parts of the short sides. Note that a direction parallel to the long side of the package PKG is referred to as a Y direction, and a direction parallel to the short side is referred to as an X direction.

Such a terminal arrangement causes the P-phase terminal 1 and the N-phase terminal 2 each to be separated from other terminals, so that a creepage distance to other terminals can be secured reliably and occurrence of electrical short circuit can be suppressed.

Figure 3:
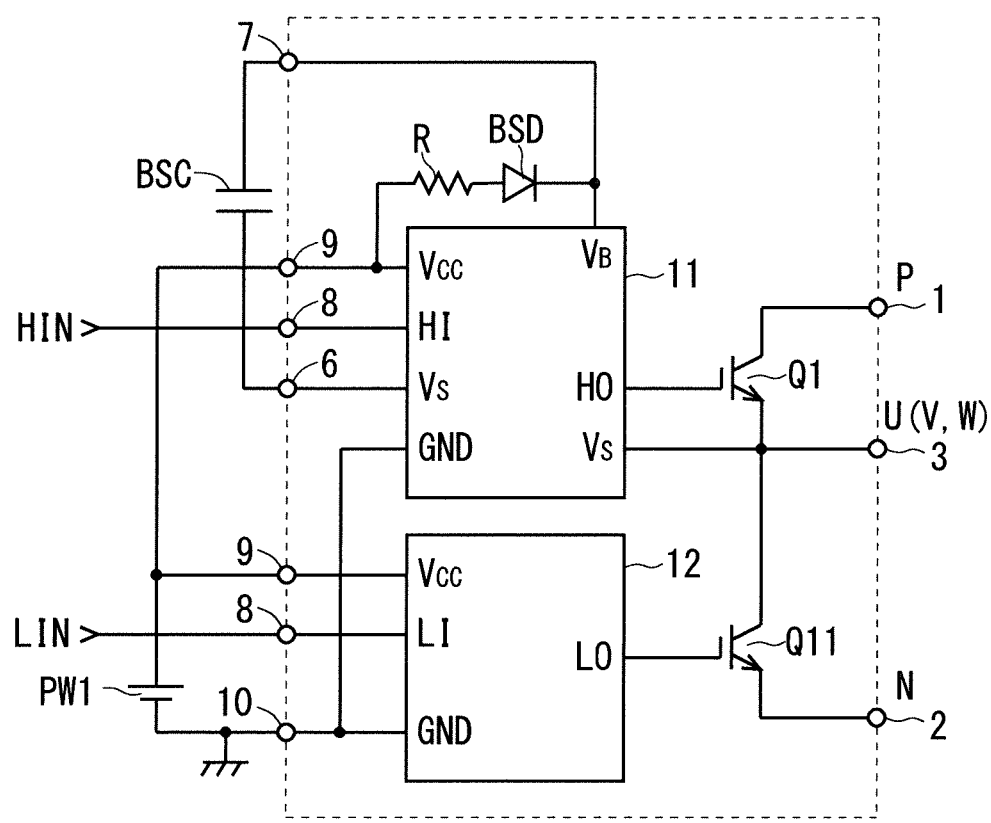
FIG. 3 is a view showing a circuit configuration of the first embodiment according to the present invention.

FIG. 3 is a view showing a circuit configuration of the semiconductor module 100. While the semiconductor module 100 is a three-phase output module for an inverter as shown in FIG. 3, a circuit configuration of only the U-phase out of 3 phases (U-phase, V-phase, and W-phase) is shown for simplicity.

The semiconductor module 100 includes: an inverter circuit in which a high-potential-side switching device Q1 (first switching device) and a low-potential-side switching device Q11 (second switching device) are connected in series between the P-phase terminal 1 on a high potential (first potential) side and the N-phase terminal 2 on a low potential (second potential) side, and a connection node of both is the U-phase output terminal 3; a high-potential-side drive circuit 11 (first drive circuit) that drives the high-potential-side switching device Q1; and a low-potential-side drive circuit 12 (second drive circuit) that drives the low-potential-side switching device Q11. Meanwhile, in this embodiment, there is shown an example using an insulated gate bipolar transistor (IGBT) as the high-potential-side switching device Q1 and the low-potential-side switching device Q11, but the present invention is not limited thereto, and a metal oxide semiconductor (MOS) transistor, or a reverse conducting (RC)-IGBT may be used.

Further, the semiconductor module 100 includes a bootstrap circuit (BS circuit). The BS circuit is configured by a bootstrap diode BSD and a current limiting resistor R connected in series between a high-potential-side driving voltage terminal Vs and a control-power voltage terminal Vcc of the high-potential-side drive circuit 11, and an external bootstrap capacitor BSC.

Further, the semiconductor module 100 has a configuration in which there is externally attached a control power supply PW1 that inputs a control-power voltage VCC to the control-power voltage terminal Vcc of the high-potential-side drive circuit 11 and the low-potential-side drive circuit 12. Note that the BS circuit is a circuit to generate a high-potential-side driving voltage VB from a high-potential-side reference voltage VS, and the high-potential-side driving voltage VB is applied to a high-potential-side reference voltage terminal Vs.

The high-potential-side drive circuit 11 is configured such that a high-potential-side input signal HIN is externally inputted to a signal input terminal HI, and a control signal for controlling driving of the high-potential-side switching device Q1 is outputted from a high-potential-side output terminal HO and applied to a gate of the high-potential-side switching device Q1. Further, the low-potential-side drive circuit 12 is configured such that a low-potential-side input signal LIN is externally inputted to a signal input end LI, and a control signal for controlling driving of the high-potential-side switching device Q11 is outputted from a low-potential-side output terminal LO and applied to a gate of the low-potential-side switching device Q11.

Now, returning to the explanation of FIG. 1, an internal configuration of the semiconductor module 100 will be described. Note that, in the following description, an expression "A and B are electrically connected" means that a current flows bidirectionally between the configuration A and the configuration B.

As shown in FIG. 1, a die pad PD3 having a rectangular shape in plan view is disposed at a center part of the semiconductor module 100, and the high-potential-side switching devices Q1, Q2, and Q3 are installed so as to align in one line in the Y direction on the die pad PD3. Then, the P-phase terminal 1 extends from one short side of the die pad PD3 and protrudes from a side surface of one short side of the package PKG. Meanwhile, a collector is provided on a lower surface of the high-potential-side switching devices Q1, Q2, and Q3 in contact with the die pad PD3, and an emitter and a gate are provided on an upper surface.

Further, die pads PD11, PD12, and PD13 are disposed on a short side opposite to the side on which the P-phase terminal 1 of the die pad PD3 extends, and low-potential-side switching devices Q11, Q12, and Q13 are installed on the die pads PD11, PD12, and PD13, respectively. Then, from the die pads PD11, PD12, and PD13, the U-phase output terminal 3, the V-phase output terminal 4, and the W-phase output terminal 5 extend respectively, and protrude from a side surface of one long side of the package PKG. Meanwhile, a collector is provided on a lower surface of each of the low-potential-side switching devices Q11, Q12, and Q13 in contact with the die pads PD11, PD12, and PD13, and an emitter and a gate are provided on an upper surface.

Since arrangement of the die pads PD11, PD12, and PD13 is provided so as to be oblique to the short side of the package PKG, the U-phase output terminal 3, the V-phase output terminal 4, and the W-phase output terminal 5 have a shape having one or more bent portions and protruding from a side surface of a long side of the package PKG. Note that the U-phase output terminal 3, the V-phase output terminal 4, and the W-phase output terminal 5 are electrically connected by a wire WR to the emitters of the high-potential-side switching devices Q1, Q2, and Q3, respectively.

Further, three N-phase terminals 2 to respectively supply power to the low-potential-side switching devices Q11, Q12, and Q13 are provided so as to protrude from a side surface of a short side opposite to the side on which the P-phase terminal 1 extends, and the three N-phase terminals 2 and the emitters of the low-potential-side switching devices Q11, Q12, and Q13 are electrically connected by the wire WR.

The high-potential-side reference voltage terminal 6, the high-potential-side driving voltage terminal 7, the control terminal 8, the control power terminal 9, and the ground terminal 10 are provided so as to protrude from a side surface of a long side opposite to the side on which the U-phase output terminal 3, the V-phase output terminal 4, and the W-phase output terminal 5 of the package PKG protrude. Then, a die pad PD2 having a rectangular shape in plan view is disposed between the terminal group and the die pad PD3, and a high-potential-side driving chip C11 and a low-potential-side driving chip C12 are installed on the die pad PD2. Note that the high-potential-side drive circuit 11 and the low-potential-side drive circuit 12 are respectively included in the high-potential-side driving chip C11 and the low-potential-side driving chip C12. Note that the die pad PD2 is a pad having a potential fixed to a ground potential, and has the ground terminal 10 extending from a long side opposite to the die pad PD3 side and protruding from a side surface of one long side of the package PKG.

There are three high-potential-side reference voltage terminals 6 and three high-potential-side driving voltage terminals 7, which are arranged alternately along the long side of the package PKG. Note that, in the example of FIG. 1, the high-potential-side reference voltage terminal 6 is arranged at a position closest to a short side (beginning of an array), and the high-potential-side driving voltage terminal 7 is arranged adjacently thereto, but the arrangement order is not limited to this. However, it is preferable to adjacently arrange the high-potential-side reference voltage terminal 6 and the high-potential-side driving voltage terminal 7 in order to externally attach the bootstrap capacitor BSC, and such an arrangement facilitates attachment of the bootstrap capacitor BSC.

While the control terminal 8 is arranged so as to follow the arrangement of the high-potential-side reference voltage terminal 6 and the high-potential-side driving voltage terminal 7, the control power terminal 9 and the ground terminal 10 are provided in the middle of the arrangement of the control terminals 8. The control power terminal 9 is a terminal extending from a die pad PD1 provided between the die pad PD2 and the terminal group, and is a terminal to which the control-power voltage VCC is inputted. The die pad PD1 has an elongated shape extending along the long side of the die pad PD2, and is electrically connected by the wire WR to an upper surface of the bootstrap diode BSD installed on each of the three high-potential-side driving voltage terminals 7. Note that a current limiting resistor R (not shown) is incorporated in the upper surface of the bootstrap diode BSD, and the wire WR is connected to the current limiting resistor R.

Further, each of the three high-potential-side reference voltage terminals 6 is electrically connected to the high-potential-side driving chip C11 by the wire WR. Further, the control terminal between the control power terminal 9 and the high-potential-side driving voltage terminal 7 is electrically connected to the high-potential-side driving chip C11 by the wire WR as a control terminal on a high potential side, and the die pad PD1 is also electrically connected to the high-potential-side driving chip C11 by the wire WR. Further, the die pad PD2 is electrically connected to the high-potential-side driving chip C11 by the wire WR. Further, the gates and the emitters of the respective high-potential-side switching devices Q1, Q2, and Q3 are electrically connected to the high-potential-side driving chip C11 by the wire WR.

The arrangement of the control terminals 8 in which the arrangement starts from next to the ground terminal 10 on a side opposite to the control power terminal 9 side is electrically connected to the low-potential-side driving chip C12 by the wire WR, as a control terminal on a low potential side. Further, the respective gates of the low-potential-side switching devices Q11, Q12, and Q13 are electrically connected to the low-potential-side driving chip C12 by the wire WR.

As described above, by disposing the die pad PD3, on which the high-potential-side switching devices Q1, Q2, and Q3 are installed, on one short side of the package PKG, and disposing the arrangement of the die pads PD11, PD12, and PD13, on which the low-potential-side switching devices Q11, Q12, and Q13 are installed, respectively, on the other short side of the package PKG, configuration can be such that the P-phase terminal 1 protrudes from the side surface of one short side, the N-phase terminal 2 protrudes from the side surface of the other short side, and other terminals protrude from the side surfaces of the two long sides of the package PKG, and it is possible to reliably secure a creepage distance to other terminals.

Second Embodiment

Figure 4:
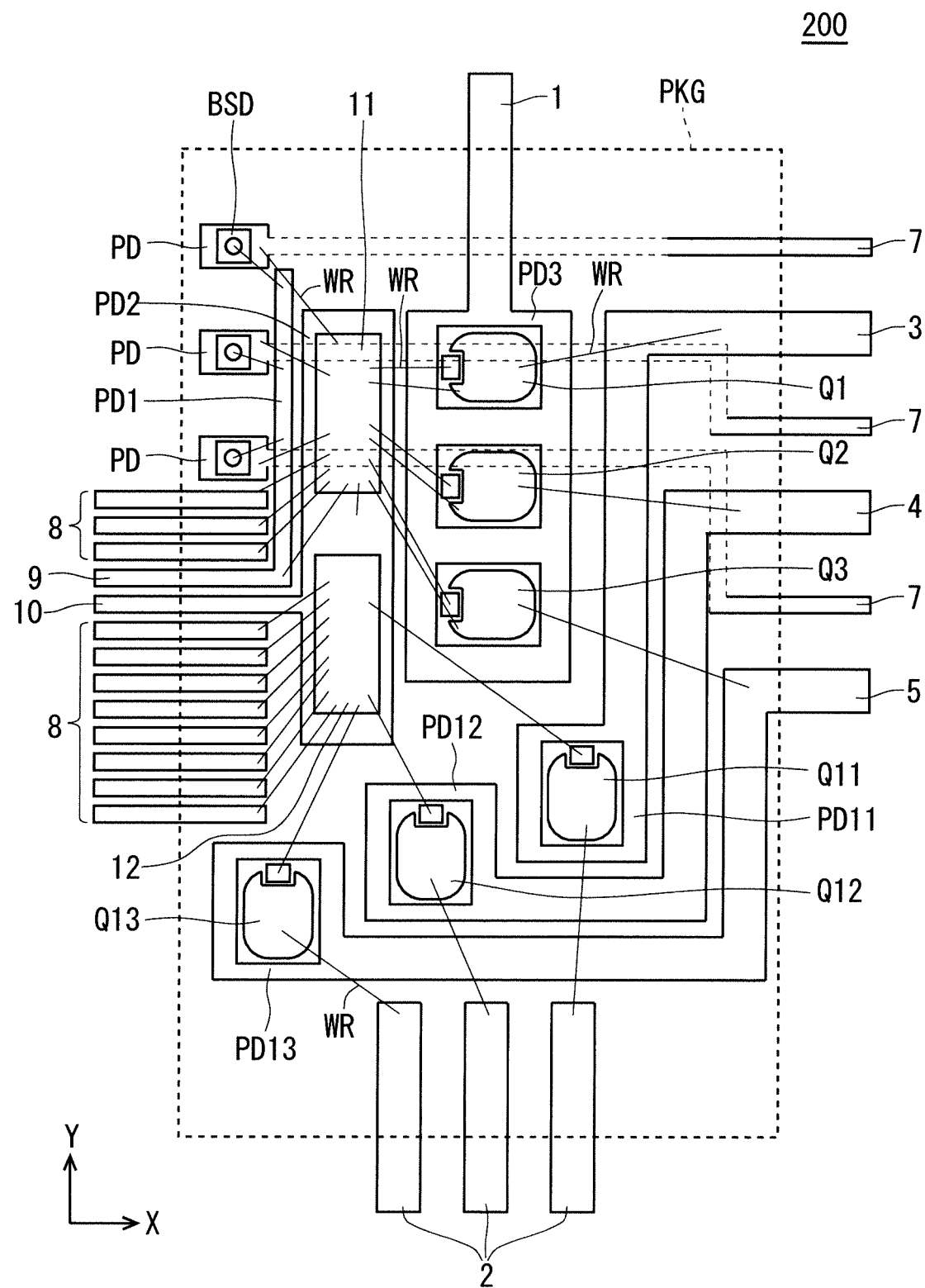
FIG. 4 is a view showing a configuration of a semiconductor module of a second embodiment according to the present invention.

FIG. 4 is a view showing a configuration of a semiconductor module 200 of a second embodiment according to the present invention, in which a package PKG is omitted in order to show a structure inside the package PKG. Further, FIG. 5 shows an appearance of an upper surface side of the semiconductor module 200 in a state sealed with the package PKG.

Figure 5:
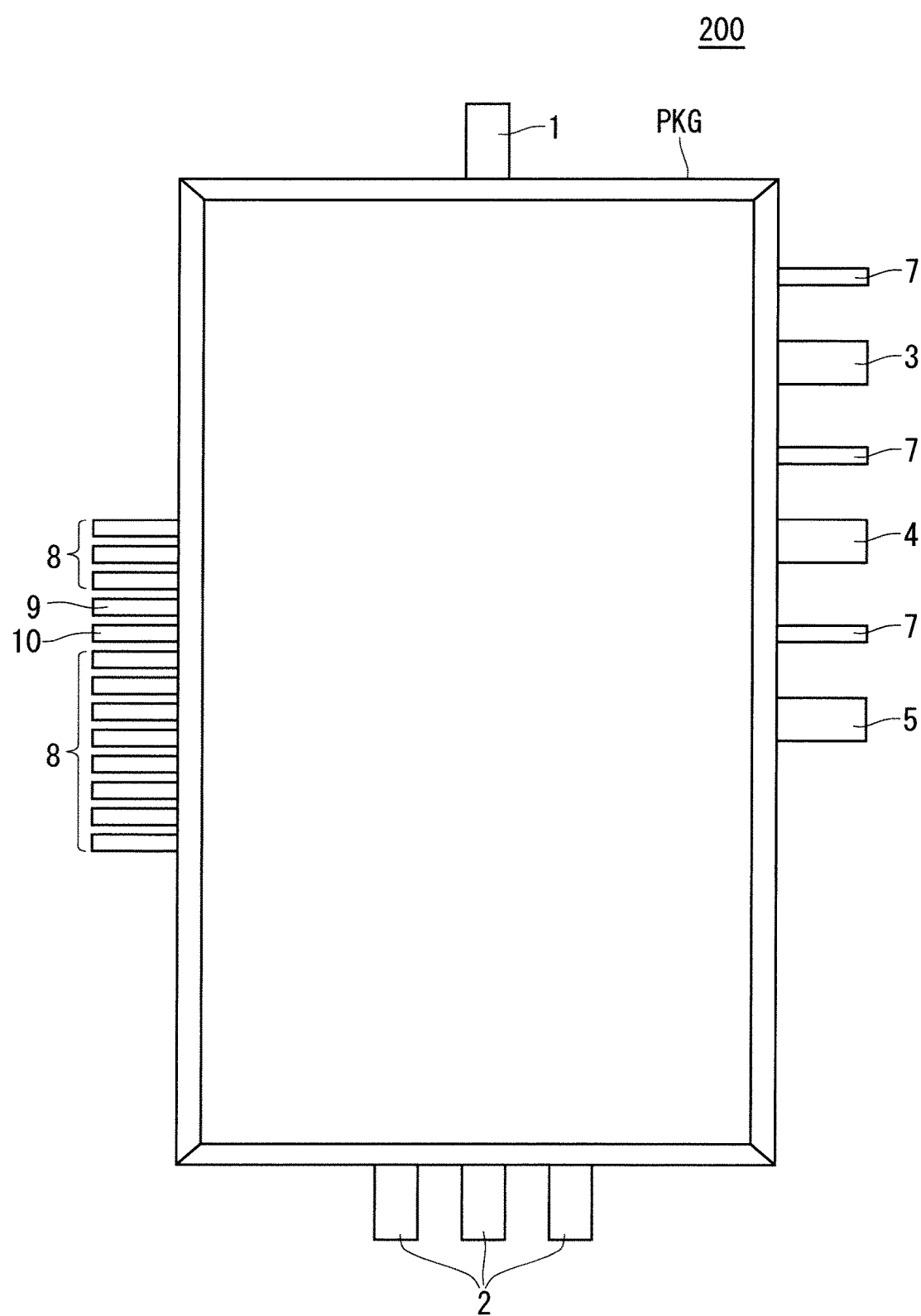
FIG. 5 is a view showing an appearance on an upper surface side of the second embodiment according to the present invention.

As shown in FIGS. 4 and 5, the semiconductor module 200 includes three high-potential-side driving voltage terminals 7, a U-phase output terminal 3, a V-phase output terminal 4, and a W-phase output terminal 5 on one long side out of two long sides of the package PKG having a rectangular shape in plan view. Further, the other long side of the package PKG is provided with a control terminal 8, a control power terminal 9, and a ground terminal 10.

As described with reference to FIG. 3, a high-potential-side driving voltage terminal VB of a high-potential-side drive circuit 11 is a terminal to which a high-potential-side driving voltage VB is applied from a bootstrap capacitor BSC, and three high-potential-side reference voltage terminals Vs of the high-potential-side drive circuit 11 are terminals to be a reference potential on a high potential side, and have the same potential as the U-phase output terminal 3, the V-phase output terminal 4, and the W-phase output terminal 5, respectively. Therefore, by arranging the three high-potential-side driving voltage terminals 7 to which the high-potential-side driving voltage VB is inputted alternately with the U-phase output terminal 3, the V-phase output terminal 4, and the W-phase output terminal 5 along one long side of the package PKG, there is no need to separately provide the high-potential-side reference voltage terminal 6, and the package PKG can be downsized by reducing the number of terminals.

As shown in FIG. 3, since a bootstrap diode BSD is installed on the high-potential-side driving voltage terminal 7, and the bootstrap diode BSD is connected between a high-potential-side driving chip C11 and the control power terminal 9 by a wire WR, the semiconductor module 200 shown in FIG. 4 is provided with three die pads PD, on which the bootstrap diode BSD is installed, on the other long side of the package PKG, and the high-potential-side driving voltage terminals 7 extending therefrom to the one long side of the package PKG. These high-potential-side driving voltage terminals 7 are provided so as to go under die pads PD1 to PD3, the U-phase output terminal 3, the V-phase output terminal 4, and the W-phase output terminal 5.

Such a structure can be realized by using an upper-layer lead frame having the die pads PD1 to PD3, the U-phase output terminal 3, the V-phase output terminal 4, and the W-phase output terminal 5, and a lower-layer lead frame having the die pad PD and the high-potential-side driving voltage terminal 7. The lower-layer lead frame has a portion of different level with respect to the upper-layer lead frame, and the portion of different level is indicated by a broken line in FIG. 4.

By configuring the high-potential-side driving voltage terminal 7 to go under the die pads PD1 to PD3, the U-phase output terminal 3, the V-phase output terminal 4, and the W-phase output terminal 5, the three high-potential-side driving voltage terminals 7 can be arranged alternately with the U-phase output terminal 3, the V-phase output terminal 4, and the W-phase output terminal 5 along one long side of the package PKG.

Note that the configuration in which a P-phase terminal 1 protrudes from a side surface of one short side, an N-phase terminal 2 protrudes from a side surface of the other short side, and other terminals protrude from side surfaces of two long sides of the package PKG is the same as that of the semiconductor module 100 of the first embodiment, and a creepage distance to other terminals can be reliably secured.

Further, in the above description, the high-potential-side driving voltage terminal 7 is configured to go under the die pads PD1 to PD3, the U-phase output terminal 3, the V-phase output terminal 4, and the W-phase output terminal 5, but it is needless to say that the high-potential-side driving voltage terminal 7 may be configured to straddle over the die pads PD1 to PD3, the U-phase output terminal 3, the V-phase output terminal 4, and the W-phase output terminal 5.

Third Embodiment

Figure 6:
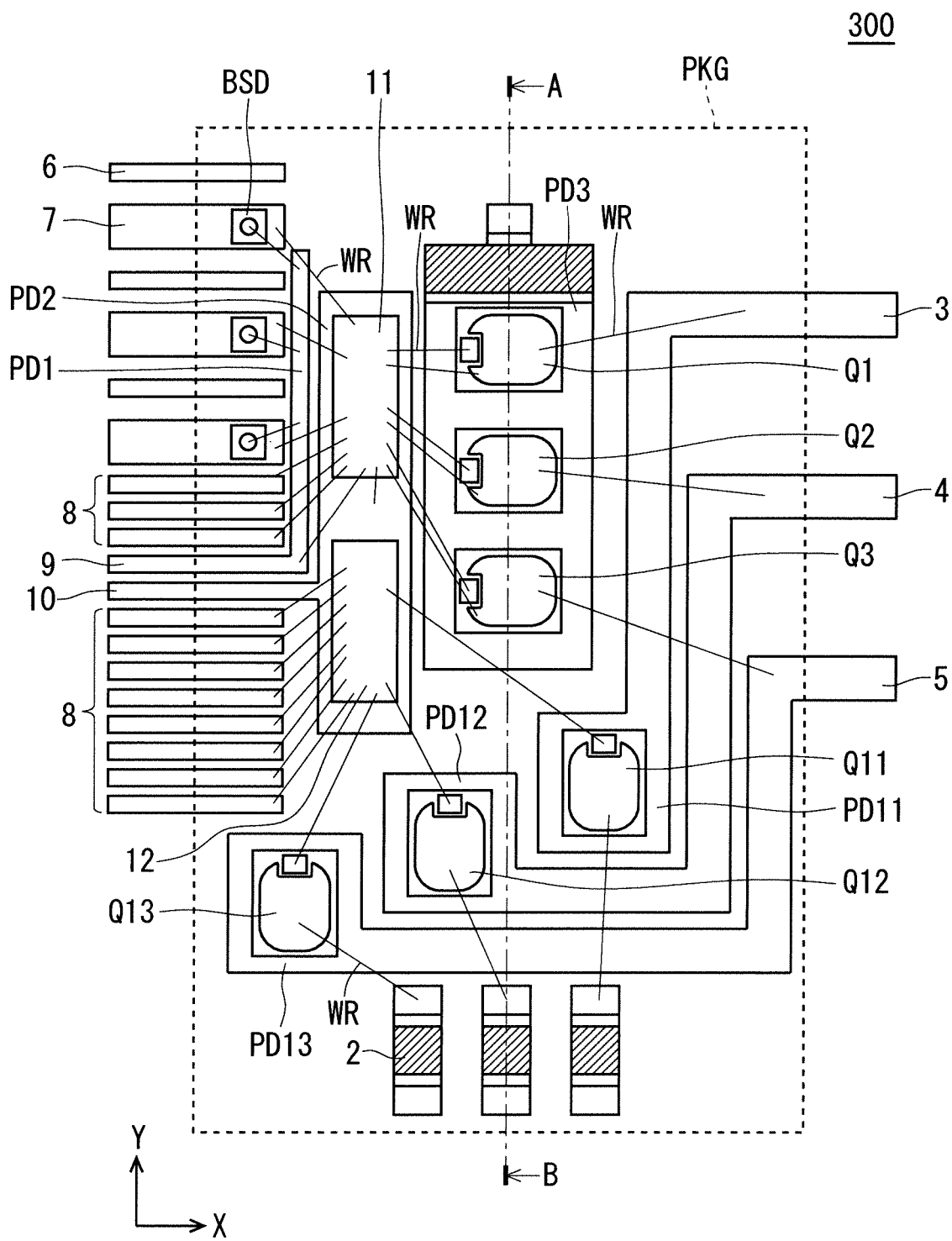
FIG. 6 is a view showing a configuration of a semiconductor module of a third embodiment according to the present invention.

FIG. 6 is a view showing a configuration of a semiconductor module 300 of a third embodiment according to the present invention, in which a package PKG is omitted in order to show a structure inside the package PKG. Further, FIG. 7 shows an appearance of a lower surface (back surface) side of the semiconductor module 300 in a state sealed with the package PKG, while FIG. 8 is a view showing a cross section taken along line A-B in FIG. 6 in an arrow direction.

Figure 7:
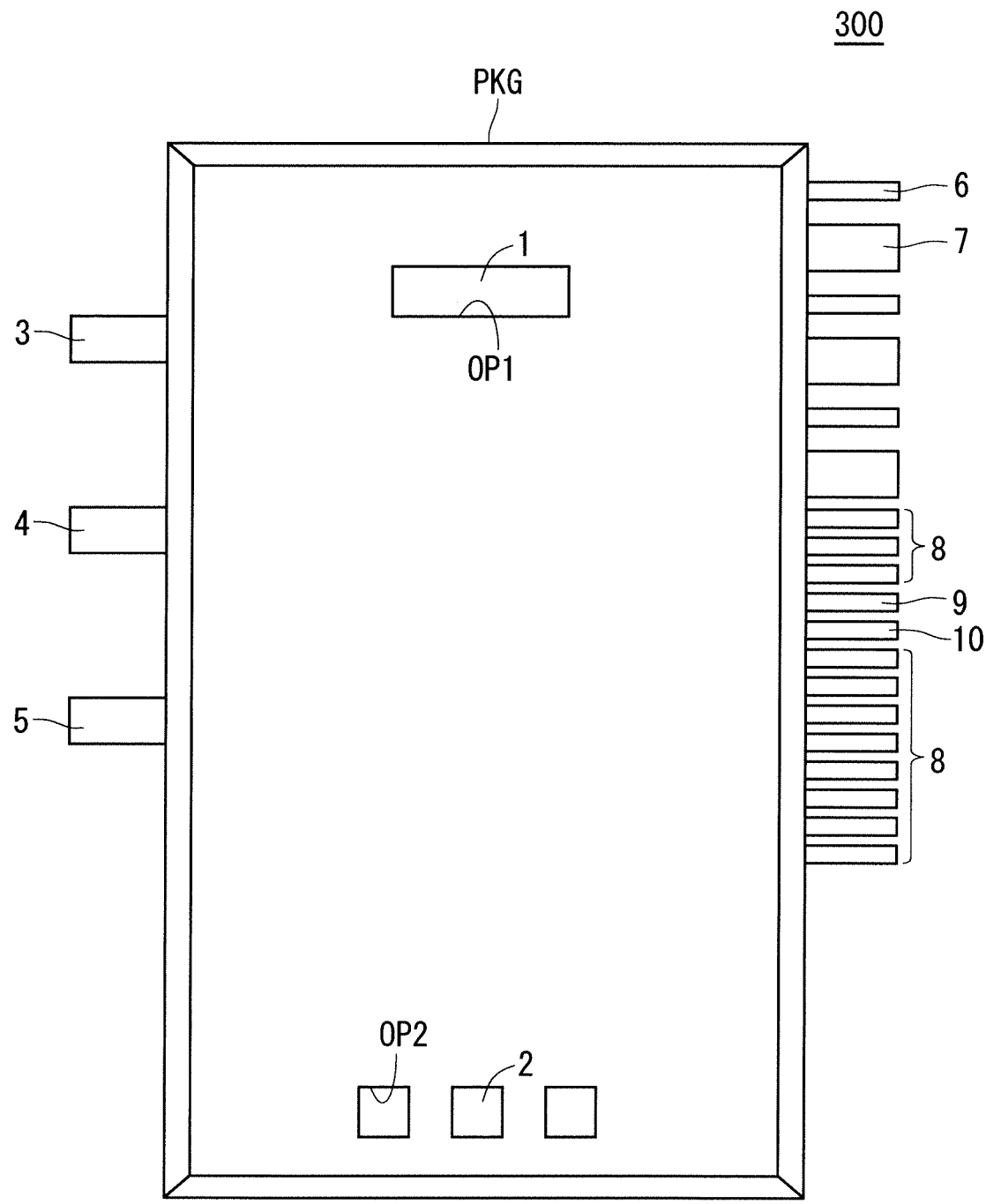
FIG. 7 is a view showing an appearance on a lower surface side of the third embodiment according to the present invention.

As shown in FIGS. 6 and 7, the semiconductor module 300 includes a high-potential-side reference voltage terminal 6, a high-potential-side driving voltage terminal 7, a control terminal 8, a control power terminal 9, and a ground terminal 10 on one long side out of two long sides of the package PKG having a rectangular shape in plan view, and includes a U-phase output terminal 3, a V-phase output terminal 4, and a W-phase output terminal 5 on the other long side. Note that no terminal is provided on two short sides of the package PKG.

Figure 8:
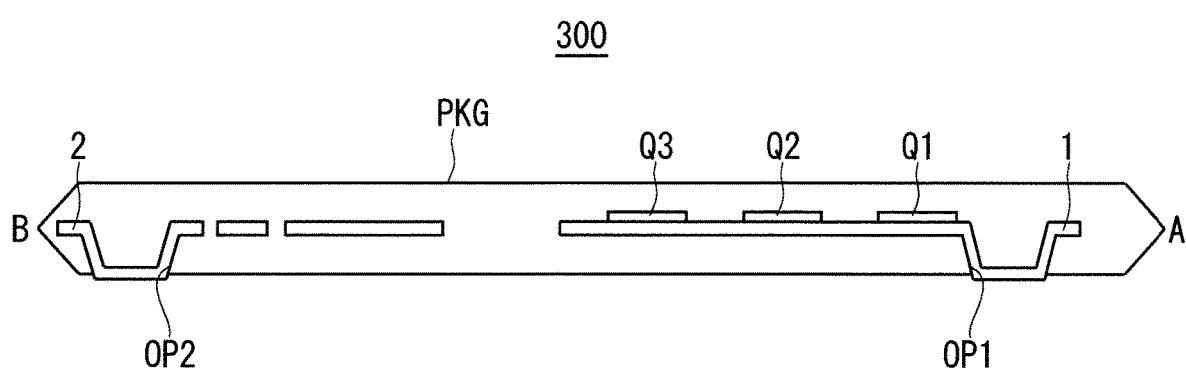
FIG. 8 is a cross-sectional view showing a configuration of the semiconductor module of the third embodiment according to the present invention.

In the semiconductor module 300, as shown in FIGS. 7 and 8, a P-phase terminal 1 and an N-phase terminal 2 have a configuration in which portions thereof are exposed at an opening OP1 (first opening) and an opening OP2 (second opening) on a lower surface of the package PKG, and the exposed portion functions as an electrode.

That is, as shown in FIG. 8, the P-phase terminal 1 has a cross-sectional shape having a portion in which a short side of a die pad PD3 is bent toward the lower surface of the package PKG, a portion bent so as to be parallel to the lower surface of the package PKG at the opening OP1 provided on the lower surface of the package PKG, and a portion bent toward an upper surface of the package PKG. Therefore, a surface of the die pad PD3 is configured to be exposed from the lower surface of the package PKG at the opening OP1, and the exposed portion functions as an electrode. Further, the N-phase terminal 2 has a cross-sectional shape having a portion bent toward the lower surface of the package PKG, a portion bent so as to be parallel to the lower surface of the package PKG at the opening OP2 provided on the lower surface of the package PKG, and a portion bent toward the upper surface of the package PKG. Therefore, a surface of the N-phase terminal 2 is configured to be exposed from the lower surface of the package PKG at the opening OP2, and the exposed portion functions as an electrode.

In this way, since the portions of the P-phase terminal 1 and the N-phase terminal 2 are exposed at the openings OP1 and OP2 on the lower surface of the package PKG, the semiconductor module 300 can be mounted on a predetermined circuit board with these portions as electrodes.

Figure 9:
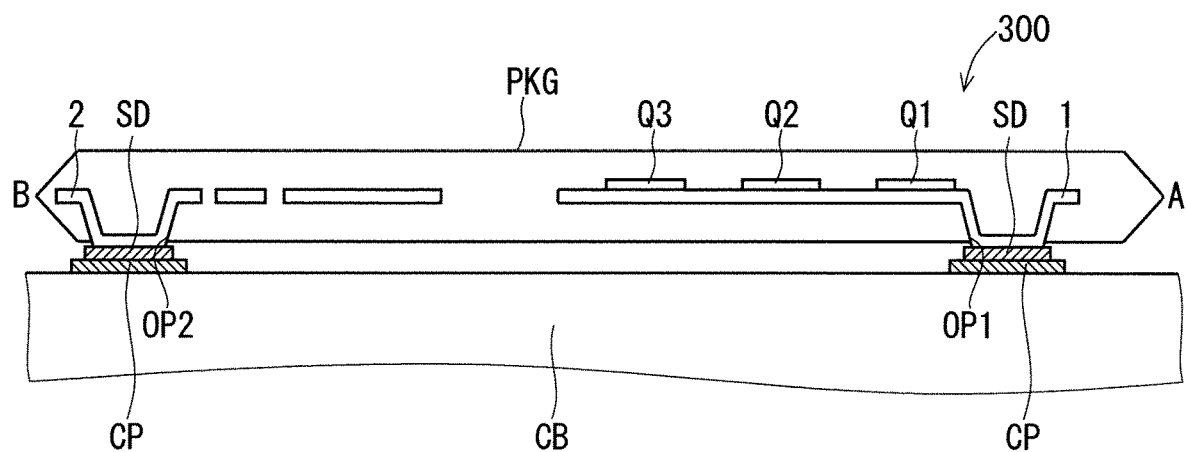
FIG. 9 is a cross-sectional view showing an example of mounting of the semiconductor module of the third embodiment according to the present invention.

FIG. 9 is a cross-sectional view showing an example of mounting, and showing a state in which the P-phase terminal 1 and the N-phase terminal 2 exposed at the openings OP1 and OP2 are joined by solder SD to a wiring pattern CP on a circuit board CB. Meanwhile, a conductive resin may be used instead of the solder SD.

In this way, by providing the P-phase terminal 1 and the N-phase terminal 2 on the back surface of the package PKG, it is possible to reliably secure a creepage distance to other terminals. Further, since only surfaces of the P-phase terminal 1 and the N-phase terminal 2 are exposed at the openings OP1 and OP2, the structure has no corner portion or edge and has high resistance to electrical short circuit. In addition, since it is possible to directly dissipate heat from the P-phase terminal 1 and the N-phase terminal 2 to the wiring pattern CP when mounted on the circuit board CB, there is also an advantage of improving heat dissipation.

Fourth Embodiment

Figure 10:
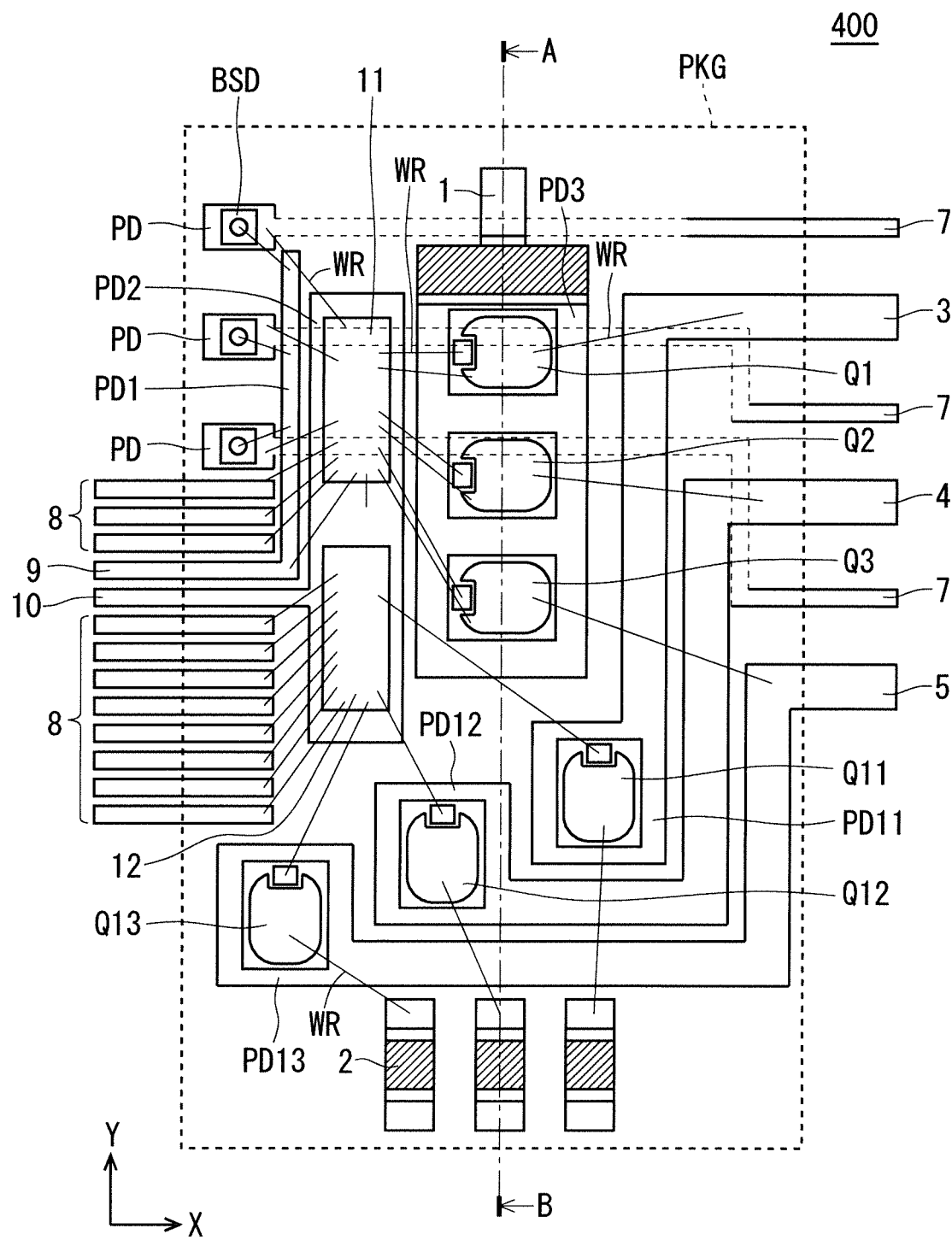
FIG. 10 is a view showing a configuration of a semiconductor module of a fourth embodiment according to the present invention.

FIG. 10 is a view showing a configuration of a semiconductor module 400 of a fourth embodiment according to the present invention, in which a package PKG is omitted in order to show a structure inside the package PKG. Further, FIG. 11 shows an appearance of a lower surface (back surface) side of the semiconductor module 400 in a state sealed with the package PKG, while FIG. 12 is a view showing a cross section taken along line A-B in FIG. 10 in an arrow direction.

As shown in FIGS. 10 and 11, the semiconductor module 400 includes three high-potential-side driving voltage terminals 7, a U-phase output terminal 3, a V-phase output terminal 4, and a W-phase output terminal 5 on one long side out of two long sides of the package PKG having a rectangular shape in plan view. Further, the other long side of the package PKG is provided with a control terminal 8, a control power terminal 9, and a ground terminal 10. Note that no terminal is provided on two short sides of the package PKG.

In the semiconductor module 400, as shown in FIGS. 11 and 12, a P-phase terminal 1 and an N-phase terminal 2 have a configuration in which portions thereof are exposed at openings OP1 and OP2 on the lower surface of the package PKG, and the exposed portion functions as an electrode.

That is, as shown in FIG. 10, the P-phase terminal 1 has a cross-sectional shape having a portion in which a short side of a die pad PD3 is bent toward the lower surface of the package PKG, a portion bent so as to be parallel to the lower surface of the package PKG at the opening OP1 provided on the lower surface of the package PKG, and a portion bent toward an upper surface of the package PKG. Therefore, a surface of the die pad PD3 is configured to be exposed from the lower surface of the package PKG at the opening OP1, and the exposed portion functions as an electrode. Further, the N-phase terminal 2 has a cross-sectional shape having a portion bent toward the lower surface of the package PKG, a portion bent so as to be parallel to the lower surface of the package PKG at the opening OP2 provided on the lower surface of the package PKG, and a portion bent toward the upper surface of the package PKG. Therefore, a surface of the N-phase terminal 2 is configured to be exposed from the lower surface of the package PKG at the opening OP2, and the exposed portion functions as an electrode.

In this way, the since portions of the P-phase terminal 1 and the N-phase terminal 2 are exposed at the openings OP1 and OP2 on the lower surface of the package PKG, it is possible to reliably secure a creepage distance to other terminals. Further, since only surfaces of the P-phase terminal 1 and the N-phase terminal 2 are exposed at the openings OP1 and OP2, the structure has no corner portion or edge and has high resistance to electrical short circuit. In addition, the semiconductor module 400 can be mounted on a predetermined circuit board with the exposed portions of the P-phase terminal 1 and the N-phase terminal 2 as electrodes, and in that case, there is also an advantage of improving heat dissipation since it is possible to directly dissipate heat from the P-phase terminal 1 and the N-phase terminal 2 to a wiring pattern on the circuit board.

Further, the high-potential-side driving voltage terminal 7 is configured to go under die pads PD1 to PD3, the U-phase output terminal 3, the V-phase output terminal 4, and the W-phase output terminal 5, and the three high-potential-side driving voltage terminals 7 can be arranged alternately with the U-phase output terminal 3, the V-phase output terminal 4, and the W-phase output terminal 5 along one long side of the package PKG. Therefore, there is no need to separately provide a high-potential-side reference voltage terminal 6, and it is also possible to downsize the package PKG by reducing the number of terminals.

Fifth Embodiment

Figure 13:
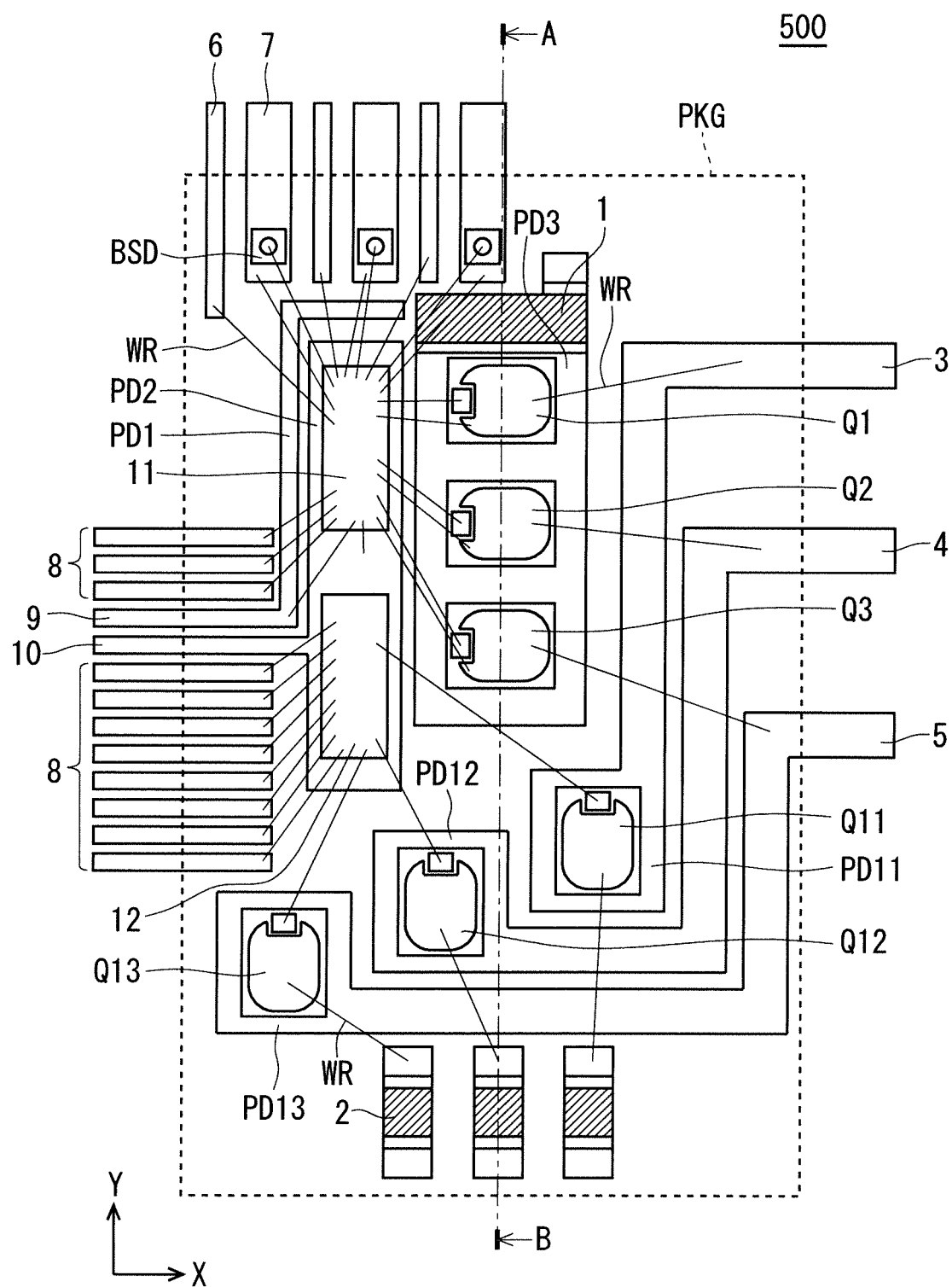
FIG. 13 is a view showing a configuration of a semiconductor module of a fifth embodiment according to the present invention.

FIG. 13 is a view showing a configuration of a semiconductor module 500 of a fifth embodiment according to the present invention, in which a package PKG is omitted in order to show a structure inside the package PKG. Further, FIG. 14 shows an appearance of a lower surface (back surface) side of the semiconductor module 500 in a state sealed with the package PKG, while FIG. 15 is a view showing a cross section taken along line A-B in FIG. 13 in an arrow direction.

Figure 14:
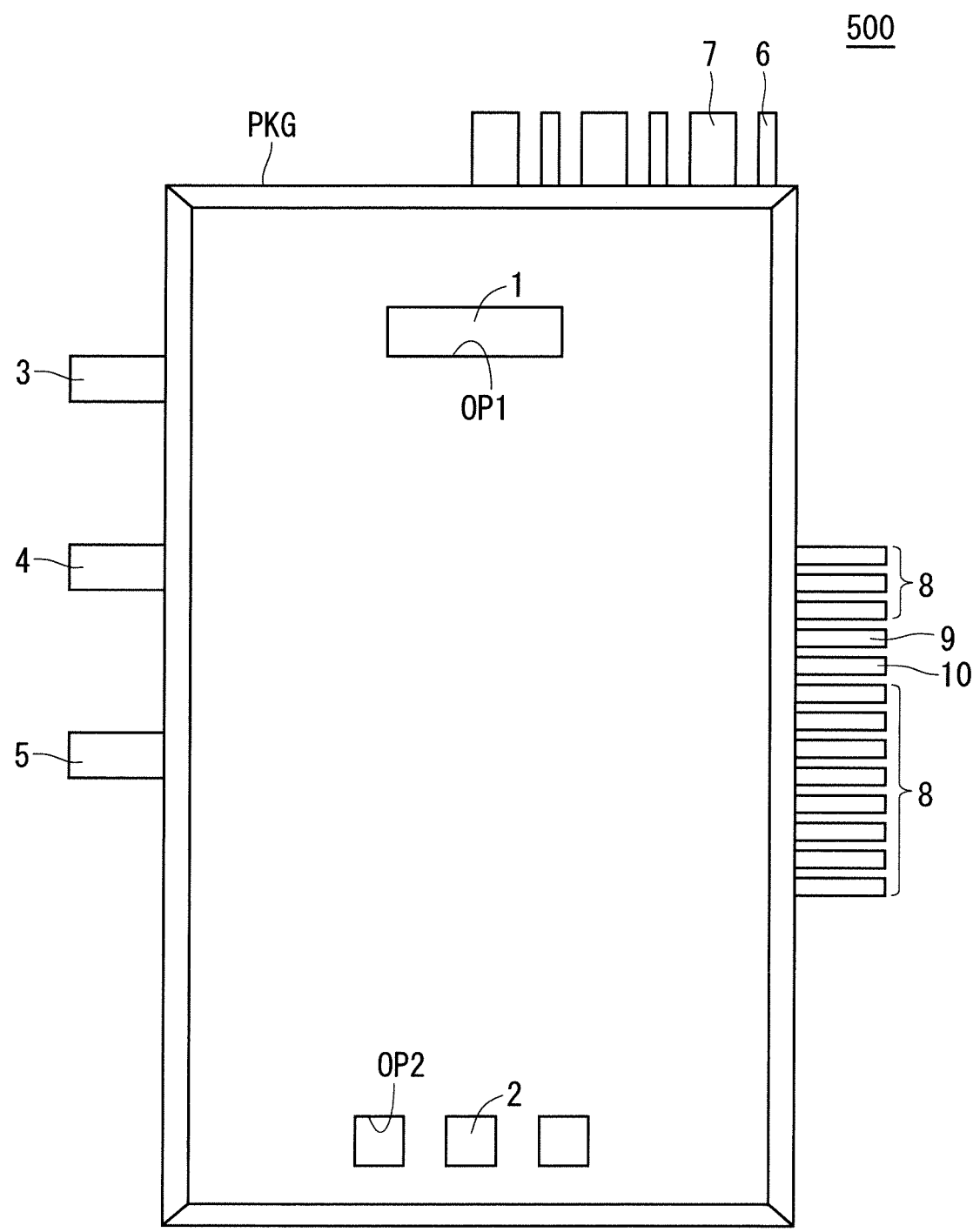
FIG. 14 is a view showing an appearance on a lower surface side of the fifth embodiment according to the present invention.

As shown in FIGS. 13 and 14, the semiconductor module 500 includes a U-phase output terminal 3, a V-phase output terminal 4, and a W-phase output terminal 5 on one long side out of two long sides of the package PKG having a rectangular shape in plan view. Further, the other long side of the package PKG is provided with a control terminal 8, a control power terminal 9, and a ground terminal 10. Further, on one short side out of two short sides of the package PKG, three high-potential-side reference voltage terminals 6 and three high-potential-side driving voltage terminals 7 are alternately provided, while no terminal is provided on the other short side.

Figure 15:
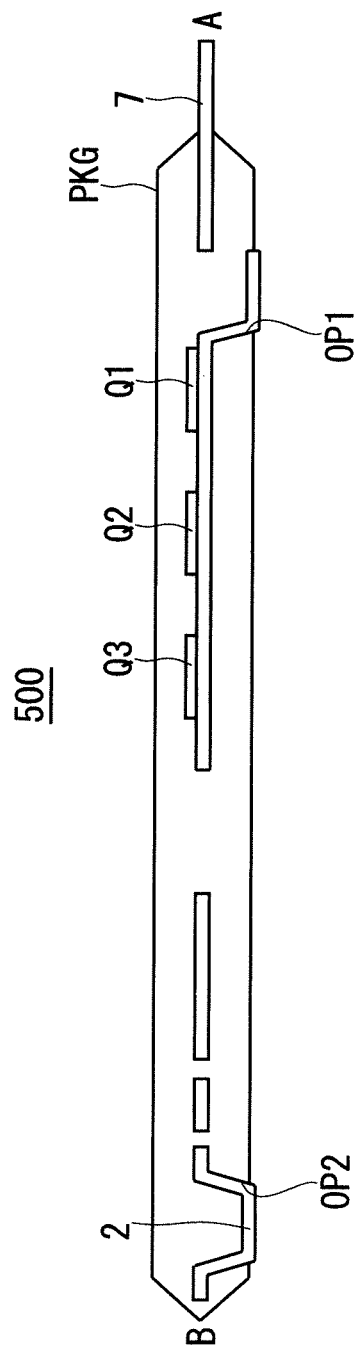
FIG. 15 is a cross-sectional view showing a configuration of the semiconductor module of the fifth embodiment according to the present invention.

In the semiconductor module 500, as shown in FIGS. 14 and 15, a P-phase terminal 1 and an N-phase terminal 2 have a configuration in which portions thereof are exposed at openings OP1 and OP2 on the lower surface of the package PKG, and the exposed portion functions as an electrode.

That is, as shown in FIG. 15, the P-phase terminal 1 has a cross-sectional shape having a portion in which a short side of a die pad PD3 is bent toward the lower surface of the package PKG, a portion bent so as to be parallel to the lower surface of the package PKG at the opening OP1 provided on the lower surface of the package PKG, and a portion bent toward an upper surface of the package PKG. Therefore, a surface of the die pad PD3 is configured to be exposed from the lower surface of the package PKG at the opening OP1, and the exposed portion functions as an electrode. Further, the N-phase terminal 2 has a cross-sectional shape having a portion bent toward the lower surface of the package PKG, a portion bent so as to be parallel to the lower surface of the package PKG at the opening OP2 provided on the lower surface of the package PKG, and a portion bent toward the upper surface of the package PKG. Therefore, a surface of the N-phase terminal 2 is configured to be exposed from the lower surface of the package PKG at the opening OP2, and the exposed portion functions as an electrode.

In this way, the since portions of the P-phase terminal 1 and the N-phase terminal 2 are exposed at the openings OP1 and OP2 on the lower surface of the package PKG, it is possible to reliably secure a creepage distance to other terminals. Further, since only surfaces of the P-phase terminal 1 and the N-phase terminal 2 are exposed at the openings OP1 and OP2, the structure has no corner portion or edge and has high resistance to electrical short circuit. In addition, the semiconductor module 500 can be mounted on a predetermined circuit board with the exposed portions of the P-phase terminal 1 and the N-phase terminal 2 as electrodes, and in that case, there is also an advantage of improving heat dissipation since it is possible to directly dissipate heat from the P-phase terminal 1 and the N-phase terminal 2 to a wiring pattern on the circuit board.

Further, the semiconductor module 500 has a configuration in which, as shown in FIG. 13, on a short side on a side where the P-phase terminal 1 of the package PKG is provided, the three high-potential-side reference voltage terminals 6 and the three high-potential-side driving voltage terminals 7 are alternately arranged along the short side, and protrude from the side surface of the short side. Note that, in the example of FIG. 13, the high-potential-side reference voltage terminal 6 is arranged at a position closest to a long side (beginning of an array), and the high-potential-side driving voltage terminal 7 is arranged adjacently thereto, but the arrangement order is not limited to this. In order to achieve such a configuration, a die pad PD1 has an L-shaped plan view shape extending not only along a long side of a die pad PD2 but also along a short side, and is electrically connected by a wire WR to an upper surface of a bootstrap diode BSD installed on each of the three high-potential-side driving voltage terminals 7.

Since both terminals to be a high potential can be separated from the terminal of a low potential by disposing the high-potential-side reference voltage terminal 6 and the high-potential-side driving voltage terminal 7 on one short side out of two short sides of the package PKG in such a manner, a creepage distance can be secured more reliably, and an effect of suppressing electrical short circuit can be further enhanced.

Sixth Embodiment

Figure 16:
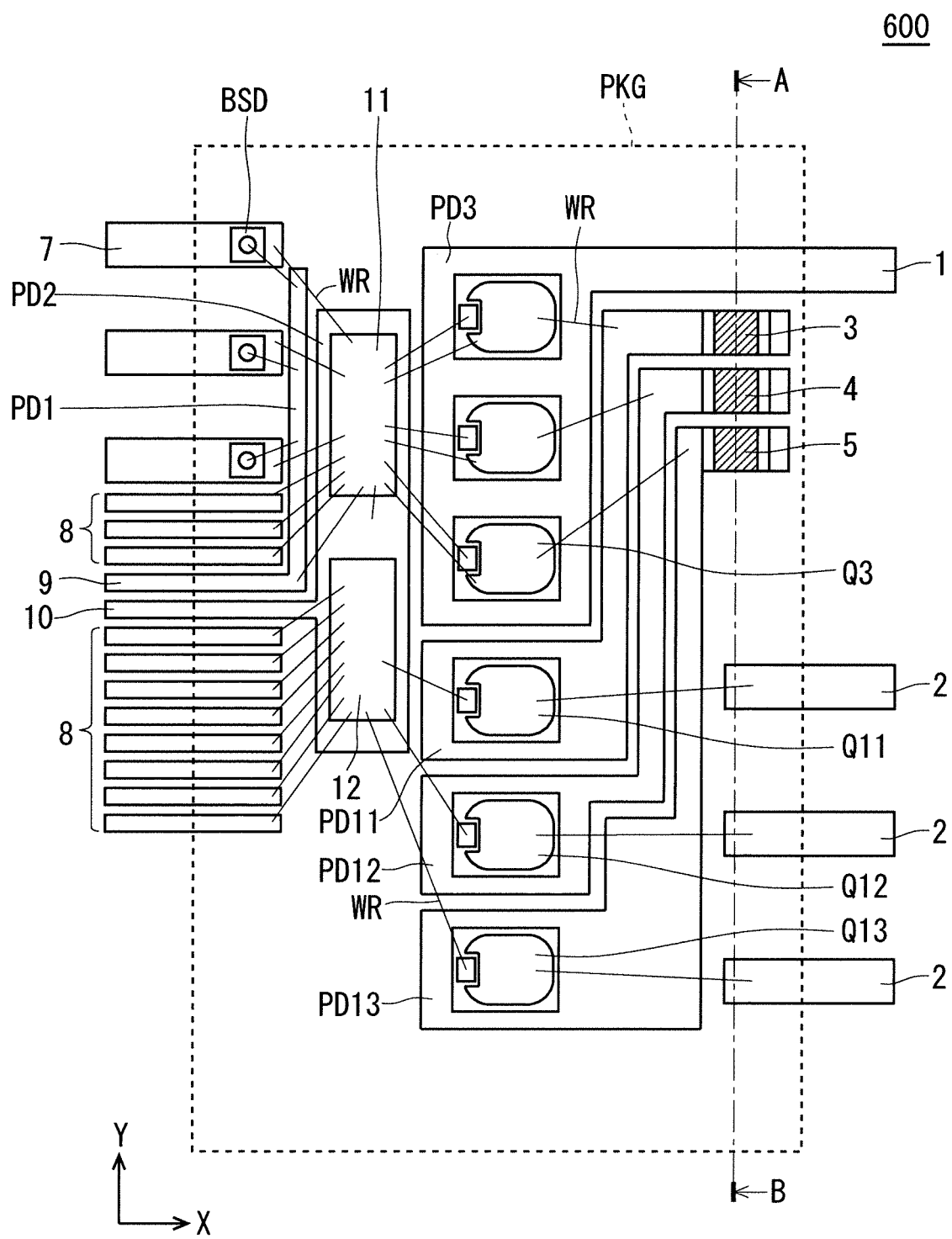
FIG. 16 is a view showing a configuration of a semiconductor module of a sixth embodiment according to the present invention.

FIG. 16 is a view showing a configuration of a semiconductor module 600 of a sixth embodiment according to the present invention, in which a package PKG is omitted in order to show a structure inside the package PKG. Further, FIG. 17 shows an appearance of a lower surface (back surface) side of the semiconductor module 600 in a state sealed with the package PKG, while FIG. 18 is a view showing a cross section taken along line A-B in FIG. 16 in an arrow direction.

Figure 17:
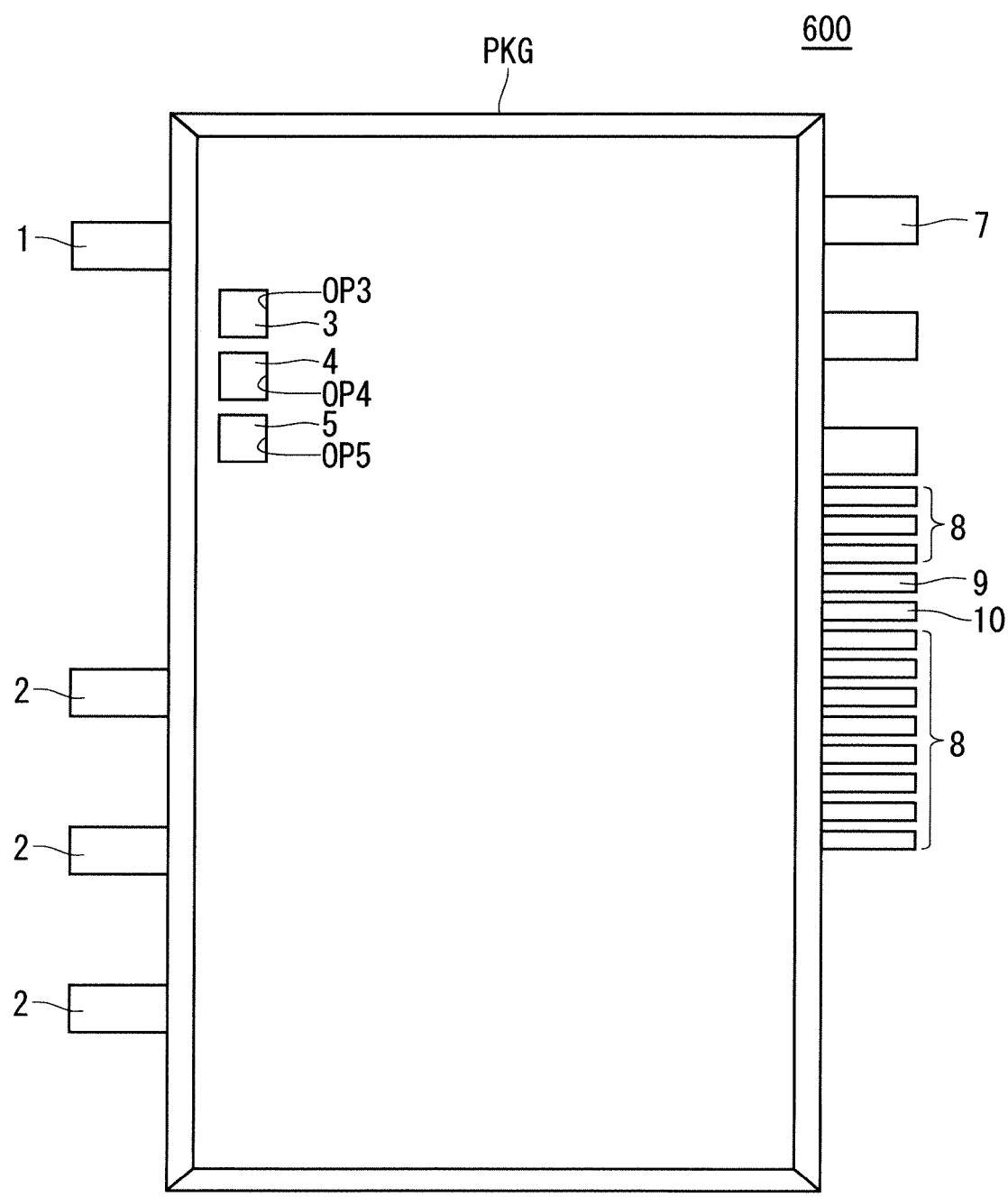
FIG. 17 is a view showing an appearance on a lower surface side of the sixth embodiment according to the present invention.

As shown in FIGS. 16 and 17, the semiconductor module 600 includes a high-potential-side driving voltage terminal 7, a control terminal 8, a control power terminal 9, and a ground terminal 10 on one long side out of two long sides of the package PKG having a rectangular shape in plan view, and includes a P-phase terminal 1 and an N-phase terminal 2 on the other long side. Note that no terminal is provided on two short sides of the package PKG.

Figure 18:
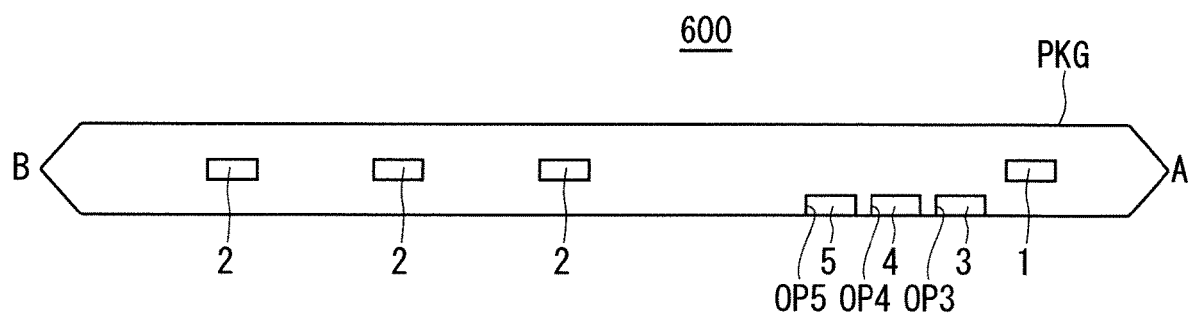
FIG. 18 is a cross-sectional view showing a configuration of the semiconductor module of the sixth embodiment according to the present invention.

The semiconductor module 600 has a configuration in which, as shown in FIGS. 17 and 18, a U-phase output terminal 3, a V-phase output terminal 4, and a W-phase output terminal 5 have one or more bent portions and extend to the vicinity of a side surface of the long side of the package PKG, but do not extend from a side surface of the long side, and the respective portions thereof are exposed at openings OP3, OP4, and OP5 (third opening) on the lower surface of the package PKG, and the exposed portion functions as a terminal.

That is, the U-phase output terminal 3 has a cross-sectional shape having a portion bent toward the lower surface of the package PKG, a portion bent so as to be parallel to the lower surface of the package PKG at the opening OP3 provided on the lower surface of the package PKG, and a portion bent toward an upper surface of the package PKG. Further, the V-phase output terminal 4 has a cross-sectional shape having a portion bent toward the lower surface of the package PKG, a portion bent so as to be parallel to the lower surface of the package PKG at the opening OP4 provided on the lower surface of the package PKG, and a portion bent toward the upper surface of the package PKG. Further, the W-phase output terminal 5 has a cross-sectional shape having a portion bent toward the lower surface of the package PKG, a portion bent so as to be parallel to the lower surface of the package PKG at the opening OP5 provided on the lower surface of the package PKG, and a portion bent toward the upper surface of the package PKG. By adopting these configurations, surfaces of the U-phase output terminal 3, the V-phase output terminal 4, and the W-phase output terminal 5 are configured to be exposed from the lower surface of the package PKG at each of the openings OP3, OP4, and OP5, and each exposed portion functions as an electrode.

In this way, since the respective portions of the U-phase output terminal 3, the V-phase output terminal 4, and the W-phase output terminal 5 are exposed at the openings OP3, OP4, and OP5 on the lower surface of the package PKG, the semiconductor module 600 can be mounted on a predetermined circuit board with each exposed portion as an electrode, and in that case, there is also an advantage of improving heat dissipation since it is possible to directly dissipate heat from the U-phase output terminal 3, the V-phase output terminal 4, and the W-phase output terminal 5 to a wiring pattern on the circuit board.

Further, in the semiconductor module 600, since the U-phase output terminal 3, the V-phase output terminal 4, and the W-phase output terminal 5 are provided on the back surface of the package PKG, it is possible to reliably secure a creepage distance to other terminals. Further, since only respective surfaces of the U-phase output terminal 3, the V-phase output terminal 4, and the W-phase output terminal 5 are exposed at the openings OP3, OP4, and OP5, the structure has no corner portion or edge and has high resistance to electrical short circuit.

Further, as described with reference to FIG. 3, a high-potential-side driving voltage terminal VB of a high-potential-side drive circuit 11 is a terminal to which a high-potential-side driving voltage VB is applied from a bootstrap capacitor BSC, and three high-potential-side reference voltage terminals Vs of the high-potential-side drive circuit 11 are terminals to be a reference potential on a high potential side, and have the same potential as the U-phase output terminal 3, the V-phase output terminal 4, and the W-phase output terminal 5, respectively. Therefore, by disposing the three high-potential-side driving voltage terminals 7 to which the high-potential-side driving voltage VB is inputted along one long side of the package PKG, and substituting the U-phase output terminal 3, the V-phase output terminal 4, and the W-phase output terminal 5 disposed on the back surface of the package PKG for a high-potential-side reference voltage terminal 6, there is no need to separately provide a high-potential-side reference voltage terminal 6, and it is also possible to downsize the package PKG by reducing the number of terminals.

Meanwhile, in a case where the bootstrap capacitor BSC is externally attached between each of the three high-potential-side driving voltage terminals 7 and the U-phase output terminal 3, the V-phase output terminal 4, and the W-phase output terminal 5, it may be done through a wiring pattern on a predetermined circuit board, so that there is no problem even if the arrangement positions of the three high-potential-side driving voltage terminals 7, the U-phase output terminal 3, the V-phase output terminal 4, and the W-phase output terminal 5 are separated.

Further, as shown in FIG. 16, the semiconductor module 600 has a configuration in which the P-phase terminal 1 extends from one long side of a die pad PD3 on which high-potential-side switching devices Q1, Q2, and Q3 are installed, and protrudes from a side surface of one long side of the package PKG. Further, arrangement of die pads PD11, PD12, and PD13 is provided so as to be parallel to the long side of the package PKG, and has a positional relationship in series with the die pad PD3. Then, the three N-phase terminals 2 are provided on an opposite side on the long side where the P-phase terminal 1 of the package PKG protrudes, and each of the three N-phase terminals 2 and the emitters of low-potential-side switching devices Q11, Q12, and Q13 are electrically connected by a wire WR.

By adopting such a configuration, it is possible to cause the P-phase terminal 1 and the N-phase terminal 2 to protrude from the side surface of one long side of the package PKG, and it is possible to separate the both from each other to secure a creepage distance.

While this invention has been described in detail, the foregoing description is in all aspects illustrative and the invention is not limited thereto. It is understood that innumerable modifications not illustrated can be envisaged without departing from the scope of the present invention.

It should be noted that the present invention can freely combine each embodiment within the scope of the invention, and can deform or omit each embodiment as appropriate.

The invention claimed is:

1. A semiconductor module comprising:
at least one pair of first and second switching devices that are inserted in series between a first potential and a second potential lower than the first potential, and operate complementarily;
a first drive circuit that performs drive control of the first switching device; and
a second drive circuit that performs drive control of the second switching device, wherein
the at least one pair of first and second switching devices and the first and second drive circuits are sealed in a package having a rectangular shape in plan view, the semiconductor module further comprising:
a control terminal provided to protrude from a side surface of a first long side out of first and second long sides of the package, and to which a control signal of the first and second drive circuits is inputted;
an output terminal provided to protrude from a side surface of the second long side and supplied with an output of the first and second switching devices;
a first main terminal provided to protrude from a side surface of a first short side out of first and second short sides of the package, and to which the first potential is applied; and
a second main terminal provided to protrude from a side surface of the second short side, and to which the second potential is applied.

2. The semiconductor module according to claim 1, wherein
the first main terminal is provided at a center part of the first short side, and
the second main terminal is provided at a center part of the second short side.

3. The semiconductor module according to claim 1, further comprising:
a reference voltage terminal provided to protrude from a side surface of the first long side, and to which a reference voltage of the first drive circuit is applied; and
a driving voltage terminal provided adjacent to the reference voltage terminal, and to which a driving voltage of the first drive circuit is applied.

4. The semiconductor module according to claim 1, further comprising:
a driving voltage terminal provided to protrude from a side surface of the first long side, and to which a driving voltage of the first drive circuit is applied, wherein
the driving voltage terminal is provided adjacent to the output terminal.

5. A semiconductor module comprising:
at least one pair of first and second switching devices that are inserted in series between a first potential and a second potential lower than the first potential, and operate complementarily;
a first drive circuit that performs drive control of the first switching device; and
a second drive circuit that performs drive control of the second switching device, wherein
the at least one pair of first and second switching devices and the first and second drive circuits are sealed in a package having a rectangular shape in plan view, the semiconductor module further comprising:

a control terminal provided to protrude from a side surface of a first long side out of first and second long sides of the package, and to which a control signal of the first and second drive circuits is inputted;
an output terminal provided to protrude from a side surface of the second long side and supplied with an output of the first and second switching devices;
a first main terminal whose surface is partially exposed from a first opening provided on a back surface of the package, the back surface being a side facing a circuit board when mounted on the circuit board, wherein the first potential is applied to the exposed part; and
a second main terminal whose surface is partially exposed from a second opening provided on the back surface, wherein the second potential is applied to the exposed portion.

6. The semiconductor module according to claim 5, further comprising:
a reference voltage terminal provided to protrude from a side surface of the first long side, and to which a reference voltage of the first drive circuit is applied; and
a driving voltage terminal provided adjacent to the reference voltage terminal, and to which a driving voltage of the first drive circuit is applied.

7. The semiconductor module according to claim 5, further comprising:
a driving voltage terminal provided to protrude from a side surface of the first long side, and to which a driving voltage of the first drive circuit is applied, wherein
the driving voltage terminal is provided adjacent to the output terminal.

8. The semiconductor module according to claim 5, further comprising:
a reference voltage terminal provided to protrude from a side surface of a first short side out of first and second short sides of the package, and to which a reference voltage of the first drive circuit is applied; and
a driving voltage terminal provided adjacent to the reference voltage terminal, and to which a driving voltage of the first drive circuit is applied.

9. A semiconductor module comprising:
at least one pair of first and second switching devices that are inserted in series between a first potential and a second potential lower than the first potential, and operate complementarily;
a first drive circuit that performs drive control of the first switching device; and
a second drive circuit that performs drive control of the second switching device, wherein
the at least one pair of first and second switching devices and the first and second drive circuits are sealed in a package having a rectangular shape in plan view, the semiconductor module further comprising:
a control terminal provided to protrude from a side surface of a first long side out of first and second long sides of the package, and to which a control signal of the first and second drive circuits is inputted;
a first main terminal provided to protrude from a side surface of the second long side, and to which the first potential is applied;
a second main terminal provided to protrude from a side surface of the second long side, and to which the second potential is applied; and
an output terminal whose surface is partially exposed from a third opening provided on a back surface of the package, the back surface being a side facing a circuit board when mounted on the circuit board, wherein an output of the first and second switching devices is applied to the exposed part.

10. The semiconductor module according to claim 9, further comprising a driving voltage terminal provided to protrude from a side surface of the first long side, and to which a driving voltage of the first drive circuit is applied.

* * * * *